US006636167B1

(12) United States Patent
Acharya et al.

(10) Patent No.: US 6,636,167 B1
(45) Date of Patent: Oct. 21, 2003

(54) METHOD OF GENERATING HUFFMAN CODE LENGTH INFORMATION

(75) Inventors: Tinku Acharya, Chandler, AZ (US); Ping-Sing Tsai, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 361 days.

(21) Appl. No.: 09/704,392

(22) Filed: Oct. 31, 2000

(51) Int. Cl.[7] ................................................ H03M 7/40
(52) U.S. Cl. ......................................................... 341/65
(58) Field of Search .............................. 341/67, 65, 106

(56) References Cited

U.S. PATENT DOCUMENTS

| | | | |
|---|---|---|---|
| 4,813,056 A | 3/1989 | Fedele | |
| 5,875,122 A | 2/1999 | Acharya | |
| 5,995,210 A | 11/1999 | Acharya | |
| 6,009,201 A | 12/1999 | Acharya | |
| 6,009,206 A | 12/1999 | Acharya | |
| 6,047,303 A | 4/2000 | Acharya | |
| 6,075,470 A | 6/2000 | Little et al. | |
| 6,091,851 A | 7/2000 | Acharya | |
| 6,094,508 A | 7/2000 | Acharya et al. | |
| 6,108,453 A | 8/2000 | Acharya | |
| 6,124,811 A | 9/2000 | Acharya et al. | |
| 6,130,960 A | 10/2000 | Acharya | |
| 6,151,069 A | 11/2000 | Dunton et al. | |
| 6,151,415 A | 11/2000 | Acharya et al. | |
| 6,154,493 A | 11/2000 | Acharya et al. | |
| 6,166,664 A | 12/2000 | Acharya | |
| 6,178,269 B1 | 1/2001 | Acharya | |
| 6,195,026 B1 | 2/2001 | Acharya | |
| 6,215,908 B1 | 4/2001 | Pazmino et al. | |
| 6,215,916 B1 | 4/2001 | Acharya | |
| 6,229,578 B1 | 5/2001 | Acharya et al. | |
| 6,233,358 B1 | 5/2001 | Acharya | |
| 6,236,433 B1 | 5/2001 | Acharya et al. | |
| 6,236,765 B1 | 5/2001 | Acharya | |
| 6,269,181 B1 | 7/2001 | Acharya | |
| 6,275,206 B1 | 8/2001 | Tsai et al. | |
| 6,285,796 B1 | 9/2001 | Acharya et al. | |
| 6,292,114 B1 * | 9/2001 | Tsai ............................ | 341/67 |
| 6,301,392 B1 | 10/2001 | Acharya | |
| 6,348,929 B1 | 2/2002 | Acharya | |
| 6,351,555 B1 | 2/2002 | Acharya et al. | |
| 6,356,276 B1 | 3/2002 | Acharya | |
| 6,366,692 B1 | 4/2002 | Acharya | |
| 6,366,694 B1 | 4/2002 | Acharya | |
| 6,373,481 B1 | 4/2002 | Tan et al. | |
| 6,377,280 B1 | 4/2002 | Acharya et al. | |
| 6,381,357 B1 | 4/2002 | Tan et al. | |
| 6,392,699 B1 | 5/2002 | Acharya | |

FOREIGN PATENT DOCUMENTS

EP  0 907 288 A2  4/1999

OTHER PUBLICATIONS

Yasushi Ooi, et al., "A 162M/bit/s Variable Length Decoding Circuit Using an Adaptive Tree Search Technique", ULSI Systems Development Labs, NEC Corp., IEEE 1994, Custom Integrated Circuits Conference, XP 000492966, pp. 651–654.

(List continued on next page.)

*Primary Examiner*—Brian Young
(74) *Attorney, Agent, or Firm*—Howard A. Skaist; Christopher K. Gagne

(57) ABSTRACT

Embodiments of a method of generating Huffman code length information are disclosed. In one such embodiment, a data structure is employed, although, of course, the invention is not limited in scope to the particular embodiments disclosed.

29 Claims, 4 Drawing Sheets

| Index | Symbols | Frequency (count) |
|---|---|---|
| 0 | a | 2 |
| 1 | b | 3 |
| 2 | c | 1 |
| 3 | d | 1 |
| 4 | e | 2 |
| 5 | f | 1 |
| 6 | g | 2 |
| 7 | h | 0 |
| 8 | i | 4 |
| 9 | j | 8 |
| 10 | k | 1 |
| 11 | l | 1 |
| 12 | m | 2 |
| 13 | n | 0 |
| 14 | o | 1 |
| 15 | p | 2 |
| 16 | q | 5 |
| 17 | r | 1 |

OTHER PUBLICATIONS

Cho, et al., "Design Low Power Variable Length Decoder Using Fine Grain Non–Uniform Table Partitioning", Dept. of EECS, Massachusetts Institute of Technology, 1997 IEEE International Sympasium on Circuits and Systems, Jun. 1997, Hong Kong, pp. 2156–2159.

Chang, et al., "VLSI Designs for High–Speed Huffman Decoder", Dept. of Electrical Engineering and Computer Science, 1991 IEEE, pp. 500–503.

Mukherjee, et al., "MARVLE: A VLSI Chip for Data Compression Using Tree–Based Codes", XP 000390613, IEEE Transactions on Very Large Scale Integration (VLSI)Systems, Jun. 1993, No. 2, New York, US, pp. 203–214.

Hirschberg, et al., "Efficient Decoding of Prefix Codes", XP 000116512, Communications of the ACM 33, Apr. 1990, No. 4, New York, US, 5 Pgs.

* cited by examiner

| Index | Symbols | Frequency (count) |
|---|---|---|
| 0 | a | 2 |
| 1 | b | 3 |
| 2 | c | 1 |
| 3 | d | 1 |
| 4 | e | 2 |
| 5 | f | 1 |
| 6 | g | 2 |
| 7 | h | 0 |
| 8 | i | 4 |
| 9 | j | 8 |
| 10 | k | 1 |
| 11 | l | 1 |
| 12 | m | 2 |
| 13 | n | 0 |
| 14 | o | 1 |
| 15 | p | 2 |
| 16 | q | 5 |
| 17 | r | 1 |

Figure 1

| entry number | Symbol Index (frequency) | Length |
|---|---|---|
| 0 | 9 (8) | 0 |
| 1 | 16 (5) | 0 |
| 2 | 8 (4) | 0 |
| 3 | 1 (3) | 0 |
| 4 | 15 (2) | 0 |
| 5 | 12 (2) | 0 |
| 6 | 6 (2) | 0 |
| 7 | 4 (2) | 0 |
| 8 | 0 (2) | 0 |
| 9 | 17 (1) | 0 |
| 10 | 14 (1) | 0 |
| 11 | 11 (1) | 0 |
| 12 | 10 (1) | 0 |
| 13 | 5 (1) | 0 |
| 14 | 3 (1) | 0 |
| 15 | 2 (1) | 0 |

Figure 2

| Group Frequency | Member of symbol in bit-flag form (bit 15 ------------------ bit 0) |
|---|---|
| 8 | 00000000 00000001 |
| 5 | 00000000 00000010 |
| 4 | 00000000 00000100 |
| 3 | 00000000 00001000 |
| 2 | 00000000 00010000 |
| 2 | 00000000 00100000 |
| 2 | 00000000 01000000 |
| 2 | 00000000 10000000 |
| 2 | 00000001 00000000 |
| 1 | 00000010 00000000 |
| 1 | 00000100 00000000 |
| 1 | 00001000 00000000 |
| 1 | 00010000 00000000 |
| 1 | 00100000 00000000 |
| 1 | 01000000 00000000 |
| 1 | 10000000 00000000 |

Figure 3

| entry number | Symbol Index (frequency) | Length |
|---|---|---|
| 0 | 9 (8) | 0 |
| 1 | 16 (5) | 0 |
| 2 | 8 (4) | 0 |
| 3 | 1 (3) | 0 |
| 4 | 15 (2) | 0 |
| 5 | 12 (2) | 0 |
| 6 | 6 (2) | 0 |
| 7 | 4 (2) | 0 |
| 8 | 0 (2) | 0 |
| 9 | 17 (1) | 0 |
| 10 | 14 (1) | 0 |
| 11 | 11 (1) | 0 |
| 12 | 10 (1) | 0 |
| 13 | 5 (1) | 0 |
| 14 | 3 (1) | 1 |
| 15 | 2 (1) | 1 |

Figure 4

| Group Frequency | Member of symbol in bit-flag form (bit 15 ------------------ bit 0) |
|---|---|
| 8 | 00000000 00000001 |
| 5 | 00000000 00000010 |
| 4 | 00000000 00000100 |
| 3 | 00000000 00001000 |
| 2 | 00000000 00010000 |
| 2 | 00000000 00100000 |
| 2 | 00000000 01000000 |
| 2 | 00000000 10000000 |
| 2 | 00000001 00000000 |
| 2 | 11000000 00000000 |
| 1 | 00000010 00000000 |
| 1 | 00000100 00000000 |
| 1 | 00001000 00000000 |
| 1 | 00010000 00000000 |
| 1 | 00100000 00000000 |
| 1 | 01000000 00000000 |
| 1 | 10000000 00000000 |

Figure 5

| Group Frequency | Member of symbol in bit-flag form (bit 15 ------------------ bit 0) |
|---|---|
| 37 | 11111111 11111111 |

Figure 6

| entry number | Symbol Index (frequency) | Length |
|---|---|---|
| 0 | 9 (8) | 2 |
| 1 | 16 (5) | 3 |
| 2 | 8 (4) | 3 |
| 3 | 1 (3) | 4 |
| 4 | 15 (2) | 4 |
| 5 | 12 (2) | 5 |
| 6 | 6 (2) | 5 |
| 7 | 4 (2) | 4 |
| 8 | 0 (2) | 4 |
| 9 | 17 (1) | 5 |
| 10 | 14 (1) | 6 |
| 11 | 11 (1) | 6 |
| 12 | 10 (1) | 5 |
| 13 | 5 (1) | 5 |
| 14 | 3 (1) | 5 |
| 15 | 2 (1) | 5 |

Figure 7

METHOD OF GENERATING HUFFMAN CODE LENGTH INFORMATION

RELATED APPLICATIONS

This patent application is related to concurrently filed U.S. patent application Ser. No. 09/704,380, titled "A Method of Performing Huffman Decoding," by Acharya et al., assigned to the assignee of the present invention and herein incorporated by reference. The subject patent application also is related to U.S. patent application Ser. No. 10/293,187, titled "A Method of Performing Huffman Decoding," by Acharya et al., assigned to the assignee of the present invention.

BACKGROUND

The present disclosure is related to Huffman coding.

As is well-known, Huffman codes of a set of symbols are generated based at least in part on the probability of occurrence of source symbols. A binary tree, commonly referred to as a "Huffman Tree" is generated to extract the binary code and the code length. See, for example, D. A. Huffman, "A Method for the Construction of Minimum—Redundancy Codes," Proceedings of the IRE, Volume 40 No. 9, pages 1098 to 1101, 1952. D. A. Huffman, in the aforementioned paper, describes the process this way:

List all possible symbols with their probabilities;

Find the two symbols with the smallest probabilities;

Replace these by a single set containing both symbols, whose probability is the sum of the individual probabilities;

Repeat until the list contains only one member.

This procedure produces a recursively structured set of sets, each of which contains exactly two members. It, therefore, may be represented as a binary tree ("Huffman Tree") with the symbols as the "leaves." Then to form the code ("Huffman Code") for any particular symbol: traverse the binary tree from the root to that symbol, recording "0" for a left branch and "1" for a right branch. One issue, however, for this procedure is that the resultant Huffman tree is not unique. One example of an application of such codes is text compression, such as GZIP. GZIP is a text compression utility, developed under the GNU (Gnu's Not Unix) project, a project with a goal of developing a "free" or freely available UNIX-like operation system, for replacing the "compress" text compression utility on a UNIX operation system. See, for example, Gailly, J. L. and Adler, M., GZIP documentation and sources, available as gzip-1.2.4.tar at the website "http://www.gzip.org/". In GZIP, Huffman tree information is passed from the encoder to the decoder in terms of a set of code lengths along with compressed text. Both the encoder and decoder, therefore, generate a unique Huffman code based upon this code-length information. However, generating length information for the Huffman codes by constructing the corresponding Huffman tree is inefficient. In particular, the resulting Huffman codes from the Huffman tree are typically abandoned because the encoder and the decoder will generate the same Huffman codes from the code length information. It would, therefore, be desirable if another approach for generating the code length information were available.

BRIEF DESCRIPTION OF THE DRAWINGS

The subject matter regarded as the invention is particularly pointed out and distinctly claimed in the concluding portion of this specification. The invention, however, both as to organization and method of operation, together with objects, features, and advantages thereof, may best be understood by reference to the following detailed description when read with the accompanying drawings in which:

FIG. 1 is a table illustrating a set of symbols with their corresponding frequency to which an embodiment in accordance with the present invention may be applied;

FIG. 2 is a table illustrating a first portion of an embodiment in accordance with the present invention, after initialization for the data shown in FIG. 1;

FIG. 3 is a table illustrating a second portion of an embodiment of the present invention, after initialization for the data shown on FIG. 2;

FIG. 4 is the table of FIG. 2, after a first merging operation has been applied;

FIG. 5 is the table of FIG. 3, after a first merging operation has been applied;

FIG. 6 is the table of FIG. 5, after the merging operations have been completed; and FIG. 7 is the table of FIG. 4, after the merging operations have been completed.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As previously described, Huffman codes for a set of symbols are generated based, at least in part, on the probability of occurrence of the source symbols. Accordingly, a binary tree, commonly referred to as a Huffman tree, is generated to extract the binary code and the code length. For example, in one application for text compression standards, such as GZIP, although, of course, the invention is limited in scope to this particular application, the Huffman tree information is passed from encoder to decoder in terms of a set of code lengths with the compressed text data. Both the encoder and decoder generate a unique Huffman code based on the code length information. However, generating the length information for the Huffman codes by constructing the corresponding Huffman tree is inefficient and often redundant. After the Huffman codes are produced from the Huffman tree, the codes are abandoned because the encoder and decoder will generate the Huffman codes based on the length information. Therefore, it would be desirable if the length information could be determined without producing a Huffman tree.

One embodiment, in accordance with the invention of a method of generating code lengths, for codes to be encoded, using a data structure, is provided. In this particular embodiment, the data structure is sorted, symbols in the data structure are combined, and symbol length is updated based, at least in part, on the frequency of the symbols being coded. In this particular embodiment, the data structure aides in the extraction of lengths of Huffman codes from a group of symbols without generating a Huffman tree where the probability of occurrence of the symbols is known. Although the invention is not limited in scope to this particular embodiment, experimental results show efficiency both in terms of computation and usage of memory suitable for both software and hardware implementation.

FIG. 1 is a table illustrating a set of symbols with their corresponding frequency, although, of course, this is provided simply as an alternative example. An embodiment of a method of generating code lengths in accordance with the present invention may be applied to this set of symbols. FIG. 1 illustrates a set of 18 symbols, although of course the invention is not limited in scope in this respect. In this particular example, although, again, the invention is not limited in scope in this respect, inspection of the frequency information reveals two symbols, index no. 7 and 13 of the shaded regions in FIG. 1, do not occur in this symbol set. Therefore, these symbols need not be considered for Huffman coding. In this particular embodiment, symbols having a zero frequency are omitted, although the invention is not restricted in scope in this respect.

In this particular embodiment, although, again, the invention is not limited in scope in this respect, the data structure to be employed has at least two portions. As has previously been indicated, it is noted that the invention is not restricted in scope to this particular data structure. Clearly, many modifications to this particular data structure may be made and still remain within the spirit and scope of what has been described. For this embodiment, however, one portion is illustrated in FIG. 2. This portion of the data structure tracks or stores the index and length information for each non-zero frequency symbol. As illustrated in FIG. 2, this portion is initialized with zero length in descending order in terms of frequency and symbol index. Of course, other embodiments are applicable, such as using ascending order, for example. FIG. 2 illustrates this first portion of an embodiment applied to the symbols of FIG. 1.

As illustrated, FIG. 2 includes 16 entries, zero to 15, corresponding to the 16 non-zero frequency symbols. In this particular data structure, although the invention is not limited in scope in this respect, the first field or column shows the associated symbol indices after the previously described sorting operation. The symbol frequency information illustrated in FIG. 2 is not part of the data structure, but is provided here merely for illustration purposes. It illustrates the descending order of the symbols in terms of frequency, in this example. The second field or column of the data structure, although, again, the invention is not limited in scope in this respect or to this particular embodiment, contains the length information for each symbol and is initialized to zero.

The second part or portion of the data structure for this particular embodiment, after initialization using the data or symbols in FIG. 2, is shown or illustrated in FIG. 3. In this particular embodiment, the first field of this portion of the data structure, that is the portion illustrated in FIG. 3, contains the frequency for the group. The second field for this particular embodiment contains bit flags. The bit flags correspond to or indicate the entry number of the symbols belonging to the group. For example, as illustrated in FIG. 3, the shaded area contains a symbol with entry no. 3. For this particular symbol, the group frequency is 3 and the bit flags are set to:

| bit number: | (15 ------------------- 3210) |
|---|---|
| bit value: | 0000 0000 0000 1000 | that is, bit number 3 is set to "1" in this example, while the remaining bits are set to "0".

As previously described, initially, the symbol to be coded is assigned a different bit flag for each symbol. Again, in this particular embodiment, although the invention is, again, not limited in scope in this respect, the code length initially comprises zero for each symbol. As shall be described in more detail hereinafter, in this particular embodiment, with the data structure initialized, symbol flags are combined beginning with the smallest frequency symbols. The symbols are then resorted and frequency information is updated to reflect the combination. These operations of combining signal flags and resorting are then repeated until no more symbols remain to be combined.

As previously described, the process is begun by initializing the data structure, such as the embodiment previously described, and setting a "counter" designated here "no_of_group", to the number of non-zero frequency symbols, here 16. Next, while this "counter," that is, no_of_group, is greater than one, the following operations are performed.

Begin
  1: Initialize the data structure (both parts I and II) as described above, and set the no_of_group to the number of non-zero frequency symbols.
  2: while (no_of_group>1){
    2.1: Merge the last two groups in the data structure of part II, and insert it back into the list. /* The merge operation for the group frequency is simply add them together, and the merge operation for the second field is simply bit-wise "OR" operation. Both are very easy to implement in term of software and hardware. FIG. 5 shows as an example for this step. As we can see the last two groups are merged and insert backed into the list (shown in shading area). Since we are always merging two groups into one, the memory can be reused and we do not need to dynamically allocate any new memory after initialization */
    2.2: Update the length information in the data structure of part I. /* This step is done by scanning the "1" bits in the merged bit-flags (second field in the data structure of part II), and increases the Length information by one in the corresponding entries in the data structure. FIG. 4 shows the updates after the merge-step shown in FIG. 5. */
    2.3: Reduce no_of_group by one.
  }/* end of while */
End As illustrated in FIG. 5, for example, the last two "groups" or "rows" in the second part or portion of the data structure are combined or merged and, as illustrated in FIG. 5, this portion of the data structure is resorted, that is, the combined symbols are sorted in the data structure appropriately based upon group frequency, in this particular embodiment.

It is likewise noted, although the invention is not limited in scope in this respect, that the merger or combining operation for the group frequency may be implemented in this particular embodiment by simply adding the frequencies together and a merger/combining operation for the second field of the data structure for this particular embodiment may be implemented as a "bitwise" logical OR operation. This provides advantages in terms of implementation in software and/or hardware. Another advantage of this particular embodiment is efficient use of memory, in addition to the ease of implementation of operations, such as summing and logical OR operations.

As previously described, a combining or merge operation results in two "groups" or "rows" being combined into one. Therefore, memory that has been allocated may be reused and the dynamic allocation of new memory after initialization is either reduced or avoided.

Next, the length information in the first portion or part of the data structure for this particular embodiment is updated to reflect the previous merging or combining operation. This is illustrated, for example, for this particular embodiment, in FIG. 4. One way to implement this operation, although the invention is not restricted in scope in this respect, is by scanning the "one" bits of the merged bit flags. That is, in this particular embodiment, the second field in the second portion of the data structure, is scanned and length information is increased or augmented by one in the corresponding entries in the first portion or part of the data structure.

Next the "counter" that is here, no_of_group, is reduced by one. The previous operations are repeated until the counter reaches the value one in this particular embodiment.

It should be noted that for this particular embodiment, once the "counter" reaches one, as illustrated in FIG. 6, there should be one group or row in the second portion of the data structure with a group frequency equal to the total group frequency and all bits in the bit flags should be set to one. However, likewise, FIG. 7 shows the final results of the code length information where this has occurred. Therefore, as illustrated in FIG. 7, the desired code length information is obtained.

As previously described, for this particular embodiment of a method of generating code length information, several advantages exist. As previously discussed, in comparison, for example, with generating the Huffman tree, memory usage is reduced and the dynamic allocation of memory may be avoided or the amount of memory to be dynamically allocated is reduced. Likewise, computational complexity is reduced.

Likewise, as previously described, operations employed to implement the previously described embodiment are relatively easy to implement in hardware or software, although the invention is not limited in scope to those embodiments in these particular operations. Thus, Huffman code length information may be extracted or produced without generating a Huffman tree.

In an alternative embodiment in accordance with the present invention, a method of encoding symbols may comprise encoding symbols using code length information; and generating the code length information without using a Huffman tree, such as, for example, using the embodiment previously described for generating code length information, although the invention is, of course, not limited in scope to the previous embodiment. It is, of course, understood in this context, that the length information is employed to encode symbols where the length information is generated from a Huffman code. Likewise, in another alternative embodiment in accordance with the present invention, a method of decoding symbols may comprise decoding symbols, wherein the symbols have been encoded using code length information and the code length information was generated without using a Huffman tree. It is, again, understood in this context, that the length information employed to encode symbols is generated from a Huffman code. Again, one approach to generate the code length information comprises the previously described embodiment.

It will, of course, be understood that, although particular embodiments have just been described, the invention is not limited in scope to a particular embodiment or implementation. For example, one embodiment may be in hardware, whereas another embodiment may be in software. Likewise, an embodiment may be in firmware, or any combination of hardware, software, or firmware, for example. Likewise, although the invention is not limited in scope in this respect, one embodiment may comprise an article, such as a storage medium. Such a storage medium, such as, for example, a CD-ROM, or a disk, may have stored thereon instructions, which when executed by a system, such as a computer system or platform, or an imaging system, may result in an embodiment of a method in accordance with the present invention being executed, such as a method of generating Huffman code length information, for example, as previously described. Likewise, embodiments of a method of initializing a data structure, encoding symbols, and/or decoding symbols, in accordance with the present invention, may be executed.

While certain features of the invention have been illustrated and described herein, many modifications, substitutions, changes and equivalents will now occur to those skilled in the art. It is, therefore, to be understood that the appended claims are intended to cover all such modifications and changes as fall within the true spirit of the invention.

What is claimed is:

1. A method of generating, for symbols to be coded, code lengths, using a data structure, said method comprising:
   sorting the data structure, combining symbols in the data structure, and updating symbol length, based, at least in part, on the frequency of the symbols being coded.

2. The method of claim 1, wherein initially each symbol to be coded is assigned a different bit flag and the same length.

3. The method of claim 2, wherein the same length initially comprises zero.

4. The method of claim 2, wherein the data structure comprises at least two portions; a first portion comprising symbol index and associated symbol length information and a second portion comprising group frequency and assign bit flag information.

5. The method of claim 4, wherein the symbols are sorted in the data structure based on frequency in descending order.

6. The method of claim 5, wherein symbols are combined in the data structure beginning with the smallest frequency symbols.

7. The method of claim 6, wherein, after the symbol length information is updated to reflect the combined symbols in the data structure, the symbols are resorted based on frequency in descending order.

8. The method of claim 4, wherein the symbols are sorted in the data structure based on frequency in ascending order.

9. The method of claim 8, wherein symbols are combined in the data structure beginning with the smallest frequency symbols.

10. The method of claim 9, wherein, after the symbol length information is updated to reflect the combined symbols in the data structure, the symbols are resorted based on frequency in ascending order.

11. The method of claim 1, wherein symbols having a zero frequency are omitted.

12. A method of generating code lengths for a grouping of symbols to be coded in accordance with a Huffman code without generating a Huffman tree comprising:
   (a) sorting the symbols by frequency and assigning a different flag and the same initial length to each symbol;
   (b) combining symbol flags beginning with the smallest frequency symbols;
   (c) resorting the symbols and updating the length information to reflect the combination; and
   repeating (b) and (c) until no more symbols remain to be combined.

13. The method of claim 12, wherein sorting the symbols by frequency includes omitting the symbols having a zero frequency.

14. The method of claim 12, wherein the same initial length comprises zero.

15. A data structure comprising:

at least two portions;

a first portion comprising symbol indices and an initially assigned length, wherein said symbol indices are sorted by frequency; and a second portion comprising group frequency information and an assigned bit flag corresponding to each respective symbol.

16. The data structure of claim 15, wherein the symbols are sorted in the data structure in descending order by frequency.

17. The data structure of claim 15, wherein the symbols are sorted in the data structure in ascending order by frequency.

18. An article comprising: a storage medium, said storage medium having stored thereon, instructions that, when executed, result in the following method of generating, for symbols to be coded, code lengths, being executed using a data structure:

sorting the data structure, combining symbols in the data structure, and updating symbol length, based, at least in part, on the frequency of the symbols being coded.

19. The article of claim 18, wherein said instructions, when executed, result in initially each symbol to be coded being assigned a different bit flag and the same length.

20. The article of claim 19, wherein said instructions, when executed, result in the data structure comprises at least two portions; a first portion comprising symbol index and associated symbol length information and a second portion comprising group frequency and assign bit flag information.

21. An article comprising: a storage medium, said storage medium having stored thereon, instructions that, when executed, result in the following method of initializing a data structure for generating code lengths for symbols to be coded, being executed:

sorting the symbols by frequency and assigning a different flag and the same initial length to each symbol.

22. The article of claim 21, wherein said instructions, when executed, further result in each symbol being assigned an initial length of zero.

23. The article of claim 21, wherein said instructions, when executed, further result in, the data structure including group frequency information for each symbol.

24. A method of encoding symbols comprising:

encoding symbols using code length information;

generating the code length information without using a Huffman tree.

25. The method of claim 24, wherein generating the code length information without using a Huffman tree comprises employing a data structure.

26. The method of claim 25, wherein said data structure includes symbol indices, group frequency information for each symbol, and an initially assigned bit flag and code length.

27. A method of decoding symbols comprising:

decoding symbols, wherein the symbols have been encoded using code length information and the code length information was generated without using a Huffman tree.

28. The method of claim 27, wherein the code length information was generated using a data structure.

29. The method of claim 27, wherein the data structure comprises symbol indices, group frequency information for each symbol, and an initially assigned bit flag and code length.

* * * * *